(12) United States Patent
Yan

(10) Patent No.: US 8,143,109 B2
(45) Date of Patent: Mar. 27, 2012

(54) METHOD FOR FABRICATING DAMASCENE INTERCONNECT STRUCTURE HAVING AIR GAPS BETWEEN METAL LINES

(75) Inventor: Shuo-Ting Yan, Miao-Li County (TW)

(73) Assignee: Innolux Display Corp., Miao-Li County (TW)

( * ) Notice: Subject to any disclaimer, the term of this patent is extended or adjusted under 35 U.S.C. 154(b) by 0 days.

(21) Appl. No.: 12/965,928

(22) Filed: Dec. 13, 2010

(65) Prior Publication Data

US 2011/0086506 A1    Apr. 14, 2011

Related U.S. Application Data

(62) Division of application No. 11/998,030, filed on Nov. 27, 2007, now abandoned.

(30) Foreign Application Priority Data

Nov. 27, 2006 (TW) .............................. 95143798 A

(51) Int. Cl.
*H01L 21/82* (2006.01)

(52) U.S. Cl. ...................................... 438/125; 257/774
(58) Field of Classification Search .................. 438/125
See application file for complete search history.

(56) References Cited

U.S. PATENT DOCUMENTS

| | | | | |
|---|---|---|---|---|
| 5,949,143 A | * | 9/1999 | Bang | 257/758 |
| 6,265,321 B1 | * | 7/2001 | Chooi et al. | 438/725 |
| 6,355,567 B1 | * | 3/2002 | Halle et al. | 438/700 |
| 2005/0275104 A1 | * | 12/2005 | Stamper | 257/758 |

* cited by examiner

*Primary Examiner* — Steven Loke
*Assistant Examiner* — Kimberly M Thomas
(74) *Attorney, Agent, or Firm* — Altis Law Group, Inc.

(57) ABSTRACT

An exemplary method for fabricating a damascene interconnect structure includes the following. First, providing a substrate. Second, depositing a multilayer dielectric film on the substrate. Third, forming a patterned photoresist on the multilayer dielectric film. Fourth, etching the multilayer dielectric film to form a plurality of trenches, a portion of each of the trenches having an enlarged width at each of sidewalls thereof. Fifth, filling the trenches with conductive metal to form conductive lines such that air is trapped in extremities of the enlarged width portions of the trenches.

20 Claims, 12 Drawing Sheets

METHOD FOR FABRICATING DAMASCENE INTERCONNECT STRUCTURE HAVING AIR GAPS BETWEEN METAL LINES

CROSS-REFERENCE TO RELATED APPLICATION

This application is a divisional application of U.S. patent application Ser. No. 11/998,030, filed Nov. 27, 2007 and entitled "DAMASCENE INTERCONNECT STRUCTURE HAVING AIR GAPS BETWEEN METAL LINES AND METHOD FOR FABRICATING THE SAME." The disclosure of such parent application is incorporated herein by reference.

BACKGROUND

1. Technical Field

The present invention relates to damascene interconnect structures and methods for fabricating them, and particularly to a method for fabricating a damascene interconnect structure that has air gaps between metal lines.

2. Description of Related Art

In semiconductor devices, such as large scale integrated circuits (LSI) and ultra-large scale integration (ULSI) integrated circuits, the damascene process has been commonly used to form interconnect lines. A typical damascene process involves etching trenches or canals in a planar dielectric layer, and then filling the trenches or canals with metal, such as aluminum or copper. After filling, the excess metal outside the trenches is planarized and polished by chemical polishing so that metal is only left within the trenches.

FIG. 8 is a cross-sectional view of a typical damascene interconnect structure. The damascene interconnect structure 1 includes a substrate 10, a dielectric layer 11 formed on the substrate 10, a plurality of trenches 15 formed in the dielectric layer 11, a plurality of metal lines 17 filled in the trenches 15, and a capping layer 19 covering the dielectric layer 11 and the metal lines 17.

A method for fabricating the damascene interconnect structure 1 is as follows. In step 1, referring to FIG. 9, a substrate 10 is provided, and a dielectric film 110 and a photoresist layer (not shown) are sequentially formed on the substrate 10. Then, the photoresist layer is formed into a patterned photoresist layer 13 by an exposure and developing process.

In step 2, referring to FIG. 10, by using the patterned photoresist layer 13 as a mask, the dielectric film 110 is etched to form a plurality of trenches 15. Thereby, remaining portions of the dielectric film 110 define a dielectric layer 11.

In step 3, referring to FIG. 11, a metal layer 170 is deposited on the dielectric layer 11 and is completely filled in the trenches 15.

In step 4, referring to FIG. 12, the metal layer 170 is polished with a chemical mechanical polishing (CMP) process. Thereby, excess portions of the metal layer 170 covering the dielectric wall 11 are removed, and only portions of the metal in the trenches 15 remain. These remaining portions form a plurality of metal lines 17. Then a capping layer 19 is deposited on the dielectric layer 11 and the metal lines 17, so as to form the damascene interconnect structure 1.

In order that the damascene interconnect structure 1 has good electrical properties, a resistance R in the metal lines 17 and a capacitance C between the metal lines 17 must both be as low as possible. This is so that the resistance-capacitance (RC) delay and leakage current caused by the resistance R and the capacitance C can be minimal.

With recent developments in semiconductor technology, millions and even billions of electronic elements can be integrated in one chip. Current flows and electrical processing occurring in a single chip are massive. Therefore leakage current and RC delay can be prevalent, and may significantly impair the performance of the chip.

What is needed is a damascene interconnect structure and a method for fabricating the same which can help ensure that performance of a corresponding integrated circuit is satisfactory.

SUMMARY

In one aspect, a method for fabricating a damascene interconnect structure includes: providing a substrate; depositing a multilayer dielectric film on the substrate; forming a patterned photoresist on the multilayer dielectric film; etching the multilayer dielectric film to form a plurality of trenches, a portion of each of the trenches having an enlarged width at each of sidewalls thereof; and filling the trenches with conductive metal to form conductive lines such that air is trapped in extremities of the enlarged width portions of the trenches.

Other novel features and advantages will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

DETAILED DESCRIPTION

Reference will now be made to the drawings to describe certain exemplary embodiments of the present disclosure in detail.

Figure 1:
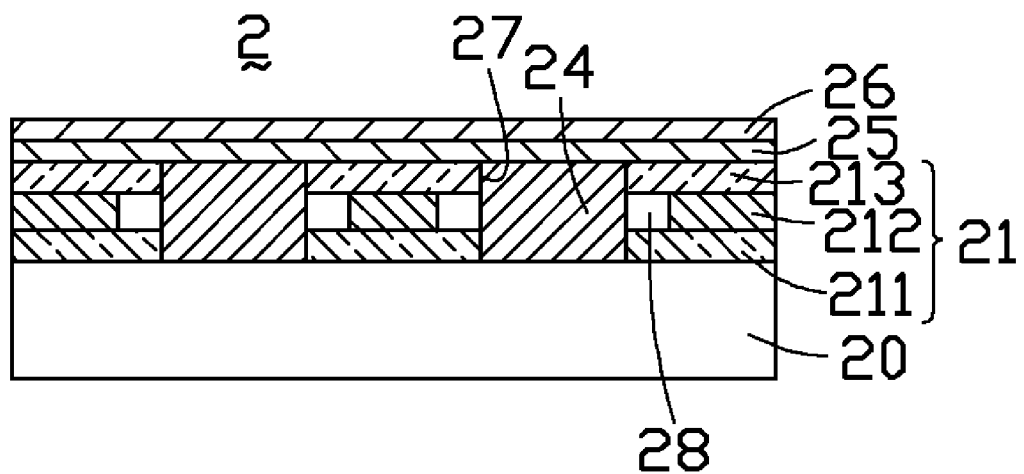
FIG. 1 is a side cross-sectional view of a damascene interconnect structure according to a preferred embodiment of the present invention.

FIG. 1 is a side cross-sectional view of a damascene interconnect structure according to a preferred embodiment of the present invention. The damascene interconnect structure 2 includes a substrate 20, a first dielectric layer 21 on the substrate 20, a plurality of trenches 27 in the first dielectric layer 21, a plurality of metal lines 24 in the trenches 27, a capping layer 25 functioning as a diffusion barrier covering the first dielectric layer 21 and the metal lines 24, and a second dielectric layer 26 on the capping layer 25 for insulating the metal lines 24 from other electrical elements.

The first dielectric layer 21 is a multilayer structure, which includes a first sub-dielectric layer 211, a second sub-dielectric layer 212, and a third sub-dielectric layer 213 arranged in that order from bottom to top. The first and the third sub-dielectric layers 211 and 213 reach side edges of the metal lines 24. The second sub-dielectric layer 212 maintains a distance from the metal lines 24, so that a plurality of air gaps 28 are maintained between the metal lines 24 and the second sub-dielectric layer 212.

As detailed above, the first dielectric layer 21 is a multilayer structure with a plurality of air gaps 28 between the metal lines 24 and the second sub-dielectric layer 212. Because each air gap 28 has the lowest dielectric constant (k=1), the capacitance C between adjacent metal lines 24 is significantly reduced. Accordingly, RC delay of electrical signals and leakage current are reduced. Therefore the speed of an integrated circuit incorporating the damascene interconnect structure 2 is significantly improved, and power consumption of the integrated circuit is reduced.

Figure 2:
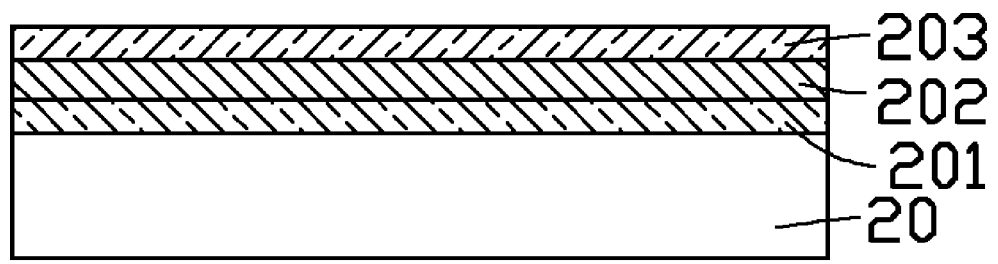
FIG. 2 to FIG. 7 are schematic, cross-sectional views of sequential stages in an exemplary method for fabricating the damascene interconnect structure of FIG. 1.

An exemplary method for fabricating the damascene interconnect structure 2 is as follows. In step 11, referring to FIG. 2, a substrate 20 is provided, and then a first, a second, and a third dielectric films 201, 202 and 203 are sequentially formed on the substrate 20. The first and the third dielectric films 201 and 203 can be silicon nitride ($SiN_x$) films, and the second dielectric film 202 can be a silicon oxide ($SiO_x$) film.

Figure 3:
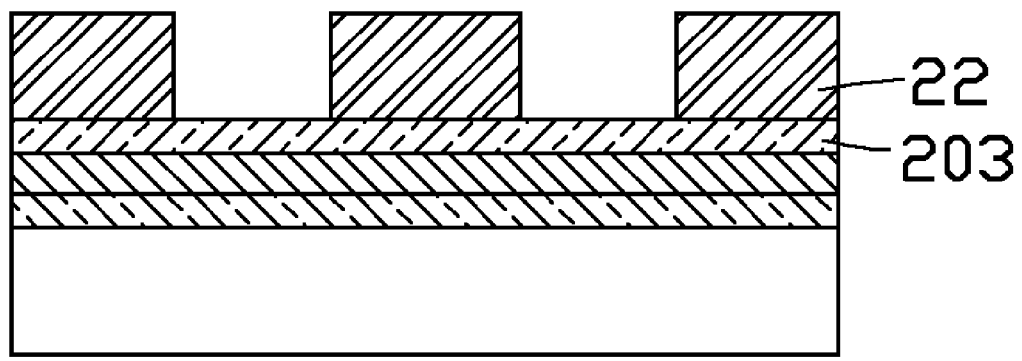

In step 12, referring to FIG. 3, a photoresist layer (not shown) is formed on the third dielectric film 203. Then the photoresist layer is exposed and developed to form a patterned photoresist layer 22.

Figure 4:
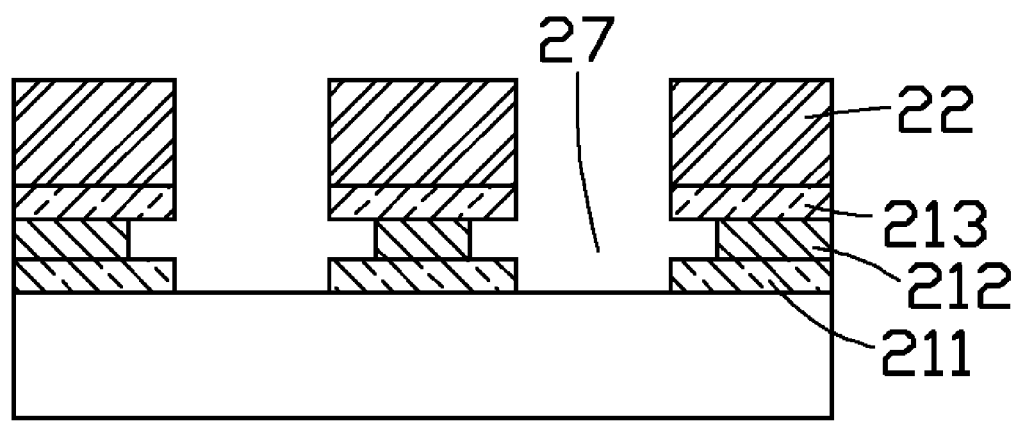

In step 13, referring to FIG. 4, the three dielectric films 201, 202, 203 are etched to form a plurality of trenches 27 by means of a wet etching method. An etchant of the wet etching method is a mixture of hydrogen fluoride (HF) and ammonium fluoride ($NH_4F$). Because silicon oxide has a faster etching rate than that of silicon nitride in the etchant, the second dielectric film 202 at the trenches 27 is etched wider than the first and the third dielectric films 201 and 203. Thus, a portion of each of the trenches 27 has an enlarged width (not labeled) at each sidewall thereof. The remaining parts of the first, the second, and the third dielectric films 201, 202 and 203 constitute first, second, and third sub-dielectric layers 211, 212 and 213, respectively. The three sub-dielectric layers 211, 212 and 213 cooperatively form a first dielectric layer 21.

Figure 5:
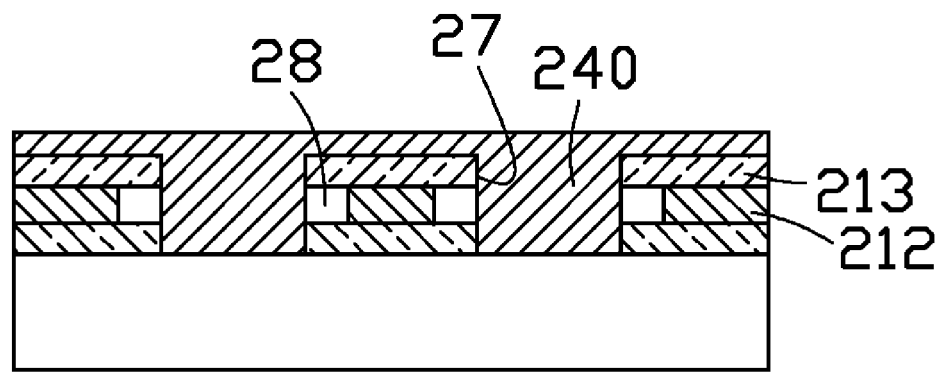

In step 14, referring to FIG. 5, the patterned photoresist layer 22 is removed. Then a metal layer 240 is deposited on the first dielectric layer 21 so that the metal layer 240 also fills into the trenches 27. This can be performed by physical vapor deposition (PVD). The metal layer 240 can be made of copper. During the PVD process, the PVD into the trenches 27 is substantially collimated. Therefore the first and the third sub-dielectric layers 211 and 213 at the trenches 27 act as barriers, and the copper atoms being deposited cannot enter the extremities of the enlarged width portions of the trenches 27. Thus air is trapped in the enlarged width portions of the trenches 27, thereby forming the air gaps 28.

Figure 6:
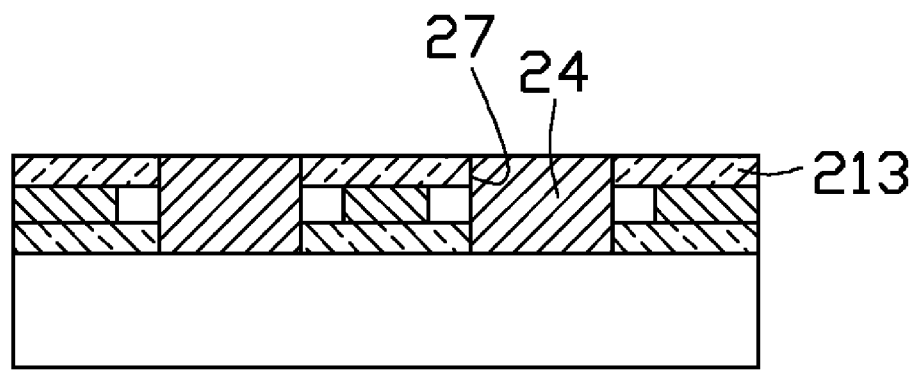

In step 15, referring to FIG. 6, the metal layer 240 is polished with a CMP process in order to remove excess portions of the metal layer 240 over the third sub-dielectric layer 213. Thereby, the portions of the metal layer 240 remaining within the trenches 27 constitute a plurality of metal lines 24.

Figure 7:
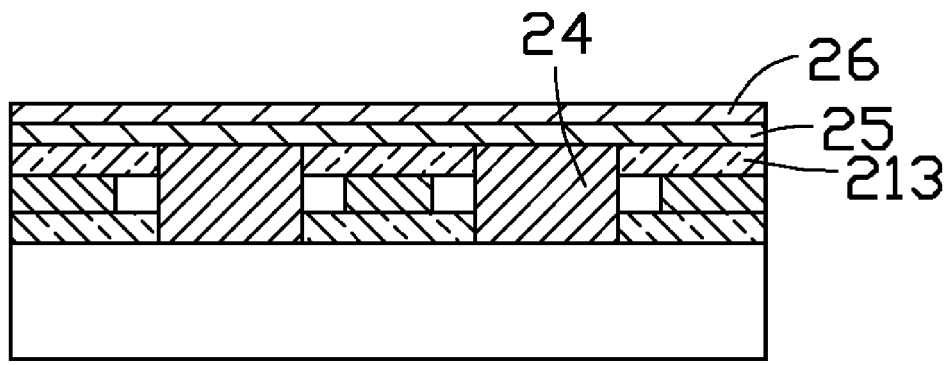
Figure 8:
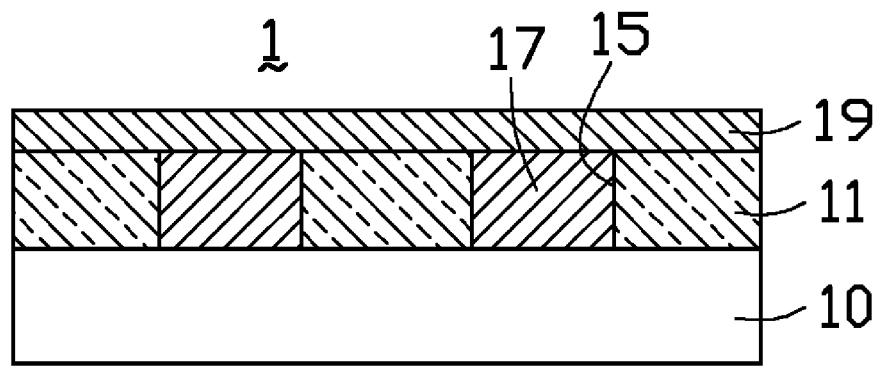
FIG. 8 is a side cross-sectional view of a conventional damascene interconnect structure.
Figure 9:
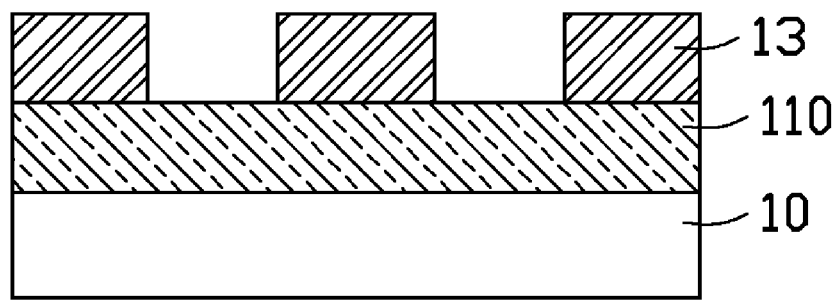
FIG. 9 to FIG. 12 are schematic, cross-sectional views of sequential stages in a method for fabricating the damascene interconnect structure of FIG. 8.
Figure 10:
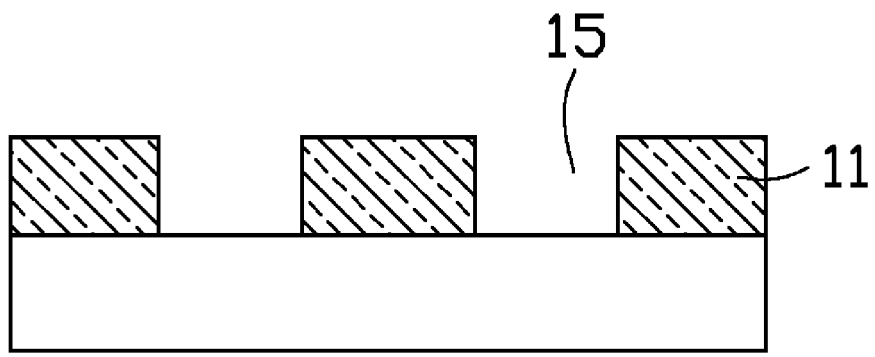
Figure 11:
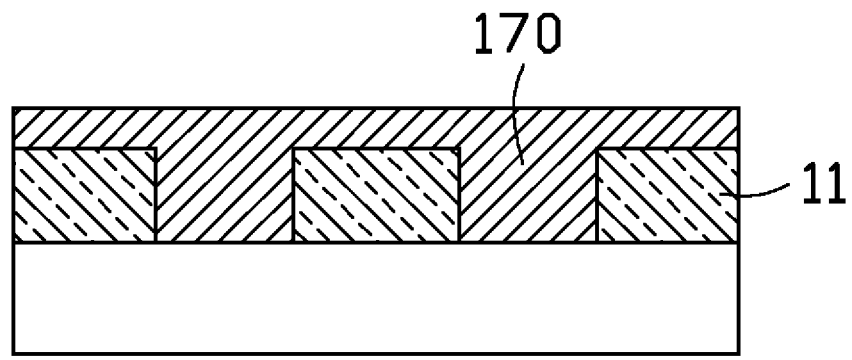
Figure 12:
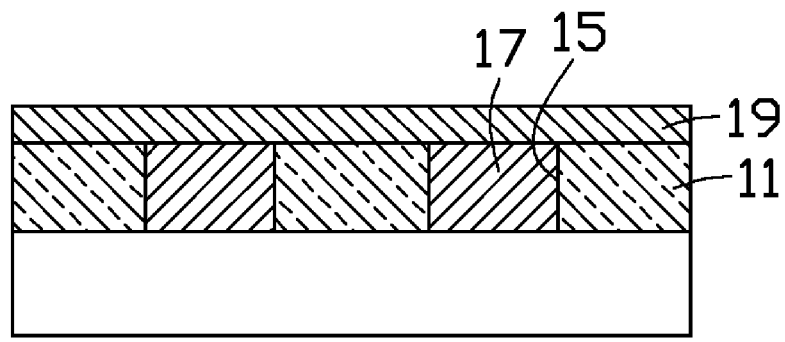

In step 16, referring to FIG. 7, a capping layer 25 is deposited on the metal lines 24 and the third sub-dielectric layer 213. Then a second dielectric layer 26 is deposited on the capping layer 25, so as to form a damascene interconnect structure 2.

In the above-described method for fabricating the damascene interconnect structure 2, the first dielectric layer 21 is formed by depositing three sub-dielectric layers 211, 212, 213 with different materials, and by etching the first dielectric layer 21 to form the trenches 27 having the enlarged width portions at the sidewalls thereof. Therefore when the metal lines 24 are formed in the trenches 27, air gaps 28 are also formed in the extremities of the enlarged width portions of the trenches 27. Because the air gaps 28 have the lowest dielectric constant of air, a capacitance C between adjacent metal lines 24 can be significantly reduced. Thus in a corresponding integrated circuit chip, RC delay in electrical signals and leakage current are reduced. Accordingly, the speed and power consumption characteristics of the integrated circuit chip can be significantly improved.

Various alternative embodiments can be practiced. For example, the first, the second, and the third sub-dielectric layers 211, 212, 213 can be made of the same material. Such material can be silicon oxide or silicon nitride. During the deposition process, a deposition rate of the second sub-dielectric layer 212 is lower than that of the first sub-dielectric layer 211, and a deposition rate of the third sub-dielectric layer 213 is higher than that of the second sub-dielectric layer 212. Therefore the densities of the first and the third sub-dielectric layers 211 and 213 are greater than that of the second sub-dielectric layer 212. Accordingly, etching rates of the first and the third sub-dielectric layers 211 and 213 are lower than that of the second sub-dielectric layer 212. During the etching process, portions of the trenches 27 at the second sub-dielectric layer 212 are wider than portions of the trenches 27 at the first and the third sub-dielectric layer 211, 213. As a result, air gaps 28 are subsequently formed between the metal lines 24.

The metal lines 24 can be made of another suitable material, such as aluminum, silver, or an alloy including any one or more of copper, aluminum and silver.

The first dielectric layer 21 can be a multilayer structure having two, four or more sub-dielectric layers, so long as air gaps 28 are maintained between the metal lines 24 and at least one of the sub-dielectric layers.

The trenches 27 can be etched by a dry etching method. In such method, the etchant can be a mixture of sulfur hexafluoride ($SF_6$) gas and carbon tetrafluoride ($CF_4$) gas.

It is to be understood, however, that even though numerous characteristics and advantages of preferred and exemplary embodiments have been set out in the foregoing description, together with details of the structures and functions of the embodiments, the disclosure is illustrative only; and that changes may be made in detail, especially in matters of shape, size, and arrangement of parts within the principles of the present invention to the full extent indicated by the broad general meaning of the terms in which the appended claims are expressed.

What is claimed is:

1. A method for fabricating a damascene interconnect structure, the method comprising:
   providing a substrate;
   depositing a multilayer dielectric film on the substrate, wherein the multilayer dielectric film comprises a first, a second, and a third sub-dielectric layers, all three sub-dielectric layers are silicon nitride layers or silicon oxide layers, and a deposition rate of each of the first and the third sub-dielectric layers is greater than that of the second sub-dielectric layer;
   forming a patterned photoresist on the multilayer dielectric film;
   etching the multilayer dielectric film to form a plurality of trenches, a portion of each of the trenches having an enlarged width at each of sidewalls thereof; and
   filling the trenches with conductive metal to form conductive lines such that air is trapped in extremities of the enlarged width portions of the trenches between the second sub-dielectric layer and the conductive lines.

2. The method for fabricating a damascene interconnect structure as claimed in claim 1, wherein the conductive metal filled in the trenches is formed by means of physical vapor deposition.

3. The method for fabricating a damascene interconnect structure as claimed in claim 1, wherein the multilayer dielectric film is etched by a wet etching method.

4. The method for fabricating a damascene interconnect structure as claimed in claim 3, wherein an etchant of the wet etching method is a mixture of hydrogen fluoride and ammonium fluoride.

5. The method for fabricating a damascene interconnect structure as claimed in claim 1, wherein the multilayer dielectric film is etched by a dry etching method.

6. The method for fabricating a damascene interconnect structure as claimed in claim 5, wherein an etchant of the dry etching method is a mixture of sulfur hexafluoride and carbon tetrafluoride.

7. The method for fabricating a damascene interconnect structure as claimed in claim 1, further comprising forming a capping layer covering the multilayer dielectric film and the conductive lines, and forming a dielectric layer on the capping layer.

8. The method for fabricating a damascene interconnect structure as claimed in claim 1, wherein material of the conductive lines is at least one item selected from the group consisting of copper, aluminum, silver, and an alloy comprising any one or more of copper, aluminum and silver.

9. A method for fabricating a damascene interconnect structure, the method comprising:
provide a substrate;
depositing a multilayer dielectric film on the substrate, wherein the multilayer dielectric film comprises a first, a second, and a third sub-dielectric layers, all three sub-dielectric layers are made from a same material, and a deposition rate of each of the first and the third sub-dielectric layers is greater than that of the second sub-dielectric layer;
forming a patterned photoresist on the multilayer dielectric film;
etching the multilayer dielectric film to form a plurality of trenches, a portion of each of the trenches having an enlarged width at each of sidewalls thereof; and
filling the trenches with conductive metal to form conductive lines such that air is trapped in extremities of the enlarged width portions of the trenches between the second sub-dielectric layer and the conductive lines.

10. The method for fabricating a damascene interconnect structure as claimed in claim 9, wherein the conductive metal filled in the trenches is formed by means of physical vapor deposition.

11. The method for fabricating a damascene interconnect structure as claimed in claim 9, wherein the multilayer dielectric film is etched by a wet etching method or a dry etching method.

12. The method for fabricating a damascene interconnect structure as claimed in claim 9, further comprising forming a capping layer covering the multilayer dielectric film and the conductive lines, and forming a dielectric layer on the capping layer.

13. The method for fabricating a damascene interconnect structure as claimed in claim 9, wherein material of the conductive lines is at least one item selected from the group consisting of copper, aluminum, silver, and an alloy comprising any one or more of copper, aluminum and silver.

14. The method for fabricating a damascene interconnect structure as claimed in claim 9, wherein all three sub-dielectric layers are silicon nitride layers or silicon oxide layers.

15. A method for fabricating a damascene interconnect structure, the method comprising:
providing a substrate;
depositing a multilayer dielectric film on the substrate, wherein the multilayer dielectric film comprises a first, a second, and a third sub-dielectric layers, all three sub-dielectric layers are made from a same material, and a deposition rate of each of the first and the third sub-dielectric layers is greater than that of the second sub-dielectric layer;
forming a patterned photoresist on the multilayer dielectric film;
etching the multilayer dielectric film to form a plurality of trenches, wherein the second sub-dielectric layer has a faster etching rate than each of the first and the third sub-dielectric layers of the multilayer dielectric film such that a portion of each of the trenches has an enlarged width at each of sidewalls thereof; and,
filling the trenches with conductive metal to form conductive lines such that air is trapped in extremities of the enlarged width portions of the trenches between the second sub-dielectric layer and the conductive lines.

16. The method for fabricating a damascene interconnect structure as claimed in claim 15, wherein the conductive metal filled in the trenches is formed by means of physical vapor deposition.

17. The method for fabricating a damascene interconnect structure as claimed in claim 15, wherein all three sub-dielectric layers are silicon nitride layers or silicon oxide layers.

18. The method for fabricating a damascene interconnect structure as claimed in claim 15, wherein the multilayer dielectric film is etched by a wet etching method or a dry etching method.

19. The method for fabricating a damascene interconnect structure as claimed in claim 15, further comprising forming a capping layer covering the multilayer dielectric film and the conductive lines, and forming a dielectric layer on the capping layer.

20. The method for fabricating a damascene interconnect structure as claimed in claim 15, wherein material of the conductive lines is at least one item selected from the group consisting of copper, aluminum, silver, and an alloy comprising any one or more of copper, aluminum and silver.

* * * * *